United States Patent
Sung et al.

(10) Patent No.: US 7,406,111 B2
(45) Date of Patent: Jul. 29, 2008

(54) SEMICONDUCTOR LASER DIODE AND METHOD FOR MANUFACTURING THE SAME

(75) Inventors: Youn-joon Sung, Yongin-si (KR); Tae-hoon Jang, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/340,590

(22) Filed: Jan. 27, 2006

(65) Prior Publication Data

US 2006/0251137 A1 Nov. 9, 2006

(30) Foreign Application Priority Data

May 7, 2005 (KR) .................. 10-2005-0038200

(51) Int. Cl.
*H01S 5/00* (2006.01)
(52) U.S. Cl. .............. 372/45.01; 372/43.01; 372/46.01; 372/50.1
(58) Field of Classification Search .............. 372/45.01, 372/46.01, 50.1
See application file for complete search history.

(56) References Cited

U.S. PATENT DOCUMENTS

| | | | | |
|---|---|---|---|---|
| 6,136,623 A * | 10/2000 | Hofstetter et al. | ............. | 438/28 |
| 6,174,747 B1 * | 1/2001 | Ho et al. | ........................ | 438/31 |
| 6,479,325 B2 * | 11/2002 | Ozawa | ........................ | 438/119 |
| 6,657,237 B2 * | 12/2003 | Kwak et al. | .................... | 257/99 |
| 7,072,374 B2 * | 7/2006 | Matsumura | .............. | 372/46.01 |
| 2004/0174918 A1 * | 9/2004 | Kwak et al. | .................... | 372/46 |
| 2005/0002428 A1 * | 1/2005 | Kwak et al. | .................... | 372/36 |
| 2005/0170542 A1 * | 8/2005 | Matsumura | .................. | 438/31 |
| 2006/0062267 A1 * | 3/2006 | Tanaka | .................... | 372/43.01 |

* cited by examiner

*Primary Examiner*—Minsun Harvey
*Assistant Examiner*—Yuanda Zhang
(74) *Attorney, Agent, or Firm*—Buchanan Ingersoll & Rooney PC

(57) ABSTRACT

In the semiconductor laser diode, a first material layer, an active layer, and a second material layer are sequentially formed on a substrate, a ridge portion and a first protrusion portion are formed on the second material layer in a direction perpendicular to the active layer, the first protrusion portion being formed at one side of the ridge portion, a second electrode layer is formed in contact with a top surface of the ridge portion, a current restricting layer is formed on an entire surface of the second material layer and exposes the second electrode layer, a protective layer is formed on a surface of the current restricting layer above the first protrusion portion and has an etch selectivity different from that of the current restricting layer, and a bonding metal layer is formed on the current restricting layer and the protective layer in electrical connection with the second electrode layer.

35 Claims, 12 Drawing Sheets

SEMICONDUCTOR LASER DIODE AND METHOD FOR MANUFACTURING THE SAME

CROSS-REFERENCE TO RELATED PATENT APPLICATION

Priority is claimed to Korean Patent Application No. 10-2005-0038200, filed on May 7, 2005, in the Korean Intellectual Property Office, the disclosure of which is incorporated herein in its entirety by reference.

BACKGROUND OF THE INVENTION

1. Field of the Disclosure

The present disclosure relates to a semiconductor laser diode and method for manufacturing the same, and more particularly, to a semiconductor laser diode and method for manufacturing the same that can prevent stress concentration on a ridge portion during a flip-chip process.

2. Description of the Related Art

Since semiconductor laser diodes have a smaller size and a low threshold current lower for laser oscillation than conventional laser devices, they are widely used for high speed data transmission, recording, and reading in the field of telecommunications and in laser disc players. Particularly, nitride semiconductor laser diodes provide waves in a green to ultraviolet region, such that they are widely used for various applications such as high density optical data recording and reproducing, high-resolution laser printers, and projection TVs.

FIG. 1 shows a semiconductor laser diode disclosed in U.S. Patent Application Publication No. 2004/0174918 A1. Referring to FIG. 1, a semiconductor laser diode includes a first material layer 120, an active layer 130, and a second material layer 140 that are sequentially formed on a substrate 110. The first material layer 120 includes a buffer layer 121, a first cladding layer 122, and a first waveguide layer 123 that are sequentially formed between the substrate 110 and the active layer 130. The second material layer 140 includes a second waveguide layer 141, a second cladding layer 142, and a cap layer 143 that are sequentially formed from the active layer 130. On an upper portion of the second material layer 140, a ridge portion 151 and a protrusion portion 152 are formed. The ridge portion 151 and the protrusion portion 152 include upper portions of the second cladding layer 142 and the cap layer 143. Also, a P-type second electrode layer 171 is formed on the cap layer 143 of the ridge portion 151. The protrusion portion 152 is formed at a similar height as the ridge portion 151 to prevent stress concentration on the ridge portion 151 during a flip-chip process. Therefore, stress can be effectively distributed when the semiconductor laser diode is flip-chip bonded to a submount (heat discharge structure), such that light can be uniformly emitted over an entire ridge waveguide region. Further, a current restricting layer 160 formed of dielectric material is formed on the surfaces of the second cladding layer 142, the protrusion portion 152, and the ridge portion 151 for controlling a lateral mode. The current restricting layer 160 exposes the second electrode layer 171 formed on a top surface of the ridge portion 151. In addition, a bonding metal layer 172 is formed on surfaces of the current restricting layer 160 and the second electric layer 171, and an N-type first electrode layer 182 is formed on an exposed surface of the buffer layer 122 that has a stepped portion beside the bonding metal layer 172.

To manufacture the semiconductor laser diode having the aforementioned structure, the first material layer 120, the active layer 130, the second material layer 140, and the second electrode layer 171 are sequentially formed on the substrate 110. Next, the ridge portion 151 and the protrusion portion 152 are formed by etching, and the current restricting layer 160 is deposited entirely over the ridge portion 151 and the protrusion portion 152. Next, a top surface of the second electrode layer 171 is exposed by photolithography with a photoresist and by etching. Then, the bonding metal layer 172 is deposited.

In this manufacturing method, however, the ridge portion 151 has a narrow top width of about several micrometers. Thus, it is difficult to precisely pattern the photoresist to expose the second electrode layer 171 during the photolithography, thereby reducing process stability.

Meanwhile, if the second electrode layer 171 is exposed by planarization, the current restricting layer 160 formed on the protrusion portion 152 is also removed by over etching. Thus, the protrusion portion 152 formed of p-GaN can be exposed. FIG. 2 is an SEM photograph showing an exposed corner "A" of the protrusion portion 152 due to over etching of the current restricting layer 160 during etch-back planarization, which is performed without preparing a protective layer above the current restricting layer 160 located on the protrusion portion 152 before forming the bonding metal layer 172 on the semiconductor laser diode of FIG. 1. As a result, if the bonding metal layer 172 is formed on the exposed protrusion portion 152, the bonding metal layer 172 makes contact with the protrusion portion 152 of the second cladding layer 142 to thereby cause current leakage.

SUMMARY OF THE DISCLOSURE

The present disclosure provides a semiconductor laser diode and method for manufacturing the same, the semiconductor laser diode having an improved structure by exposing a top surface of a second electrode layer through a planarization process for manufacturing process stability.

According to an aspect of the present invention, there is provided a semiconductor laser diode including: a first material layer, an active layer, and a second material layer that are sequentially formed on a substrate; a ridge portion and a first protrusion portion that are formed on the second material layer in a direction perpendicular to the active layer, the first protrusion portion being formed at one side of the ridge portion; a second electrode layer formed in contact with a top surface of the ridge portion; a current restricting layer formed on an entire surface of the second material layer and exposing the second electrode layer; a protective layer formed on a surface of the current restricting layer above the first protrusion portion and having an etch selectivity different from that of the current restricting layer; and a bonding metal layer formed on the current restricting layer and the protective layer in electrical connection with the second electrode layer.

The first material layer may include a buffer layer, a first cladding layer, and a first waveguide layer that are sequentially formed on the substrate. The second material layer may include a second waveguide layer and a second cladding layer that are sequentially formed on the active layer, and the ridge portion and the first protrusion portion may be formed on the second cladding layer.

The current restricting layer may be formed of at least one material selected from the group consisting of $SiO_2$, $SiN_x$, and Si. Also, the current restricting layer may be formed of N-type AlGaN or undoped AlGaN.

The protective layer may be formed of at least one selected from the group consisting of metal, $ZrO_2$, $HfO_2$, $Al_2O_3$, $Ta_2O_5$, and AlN. The metal may include at least one selected from the group consisting of Pt, Pd, Ni, Mo, W, Ru, Ta, Al, Ag, Ir, Co, Os, Cr, Ti, Zr, and Rh. The protective layer may have a thickness of 10 nm to 500 nm. The protective layer may be formed to cover a corner portion of the current restricting layer above the first protrusion portion.

The first protrusion portion may be formed at substantially the same height as the ridge portion. A top surface of the bonding metal layer located above the first protrusion portion may have at least the same height as a top surface of the bonding metal layer located above the ridge portion.

The first material layer may include an exposed surface at the other side of the ridge portion, and a first electrode layer may be formed on the exposed surface.

A second protrusion may be formed at the other side of the ridge portion at substantially the same height as the ridge portion. Here, the second protrusion portion may be separated from the ridge portion by a trench defined therebetween to expose the first material layer, and a first electrode layer may be formed on the current restricting layer above the second protrusion portion in electrical connection with the exposed surface of the first material layer. A top surface of the first electrode layer located above the second protrusion portion may have at least the same height as a top surface of the bonding metal layer located above the ridge portion. A top surface of the bonding metal layer located above the first protrusion portion may have the same height as the top surface of the first electrode layer located above the second protrusion portion. A top surface of the bonding metal layer located above the first protrusion portion and the top surface of the first electrode layer located above the second protrusion portion may be different in height by 0.5 µm or less. The semiconductor laser diode may further include a protective layer between the current restricting layer and the first electrode layer that are formed on the second protrusion portion.

Meanwhile, the first electrode layer may be formed on a bottom surface of the substrate.

According to another aspect of the present invention, there is provided a method for manufacturing a semiconductor laser diode, the method including: sequentially forming a first material layer, an active layer, a second material layer, and an electrode layer on a substrate; forming a ridge portion and a protrusion portion on upper portions of the second material layer by sequentially etching the electrode layer and the second material layer; forming a current restricting layer to cover the second material layer and the electrode layer; forming a protective layer on the current restricting layer above the protrusion portion, the protective layer being formed of material having an etch selectivity different from that of the current restricting layer; exposing the protective layer and the electrode layer formed on the ridge portion through planarization; and forming a bonding metal layer on the current restricting layer to cover the electrode layer and the protective layer.

The method may further include removing the electrode layer from the protrusion portion after the forming of the ridge portion and the protrusion portion.

The exposing of the protective layer and the electrode layer may include: depositing photoresist on the current restricting layer to a predetermined thickness to cover the protective layer; sequentially etching the photoresist and the current restricting layer formed above the ridge portion to expose the protective layer and the electrode layer formed on the ridge portion; and removing the photoresist remained on the current restricting layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EXEMPLARY EMBODIMENTS

Figure 1:
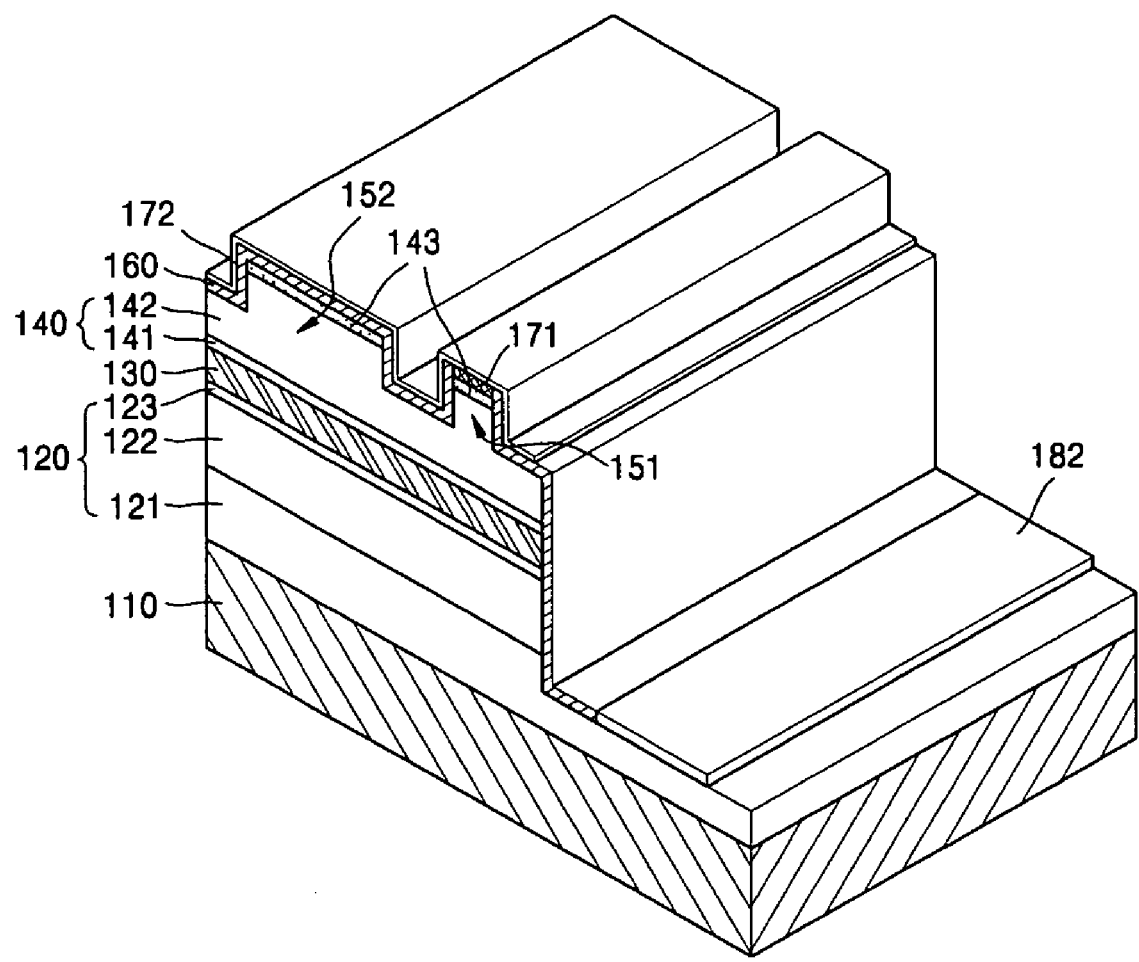
FIG. 1 is a perspective view of a semiconductor laser diode according to the related art.

The present invention will now be described more fully with reference to the accompanying drawings, in which exemplary embodiments of the invention are shown. Like reference numerals in the drawings denote like elements.

Figure 3:
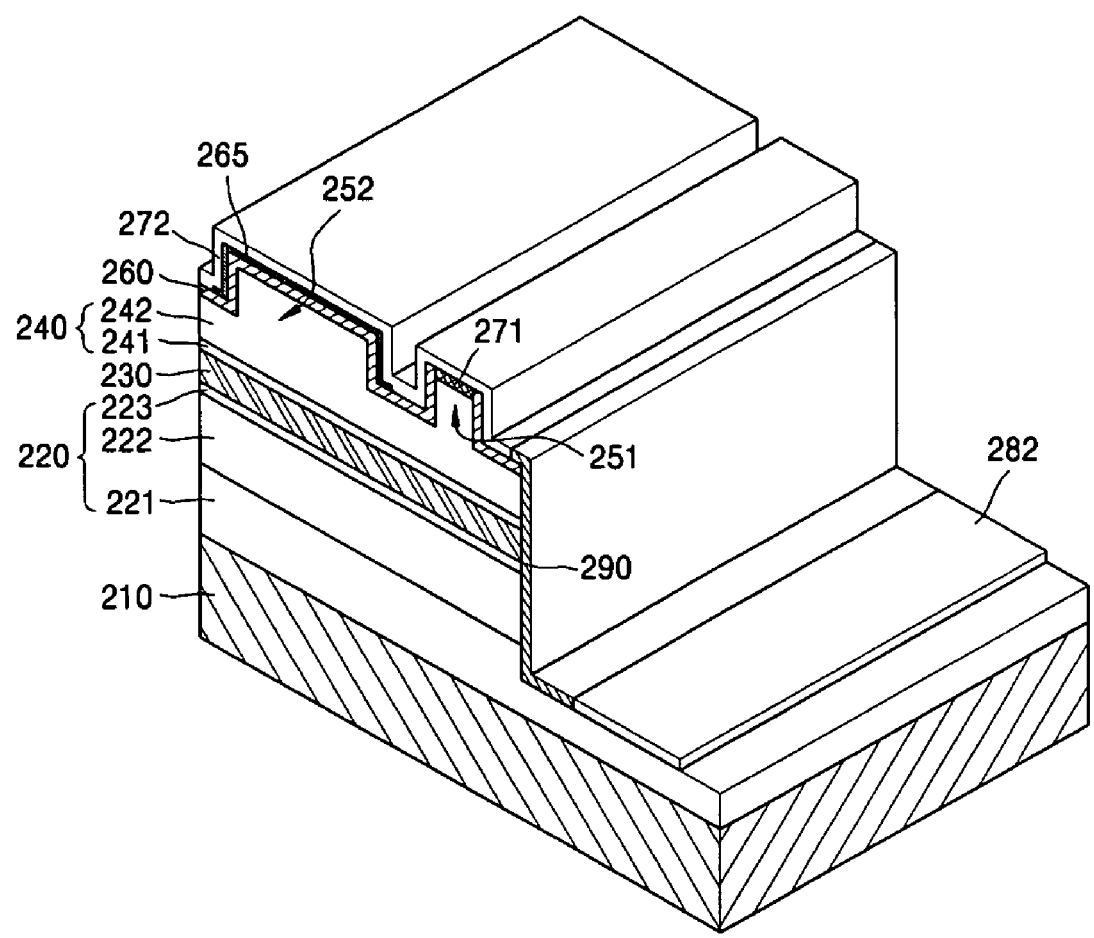
FIG. 3 is a perspective view of a semiconductor laser diode according to an embodiment the present invention.

FIG. 3 is a perspective view of a semiconductor laser diode according to an embodiment the present invention. Referring to FIG. 3, a first material layer 220, an active layer 230, and a second material layer 240 are sequentially formed on a substrate 210. The first material layer 220 includes a buffer layer 221, a first cladding layer 222, and a first waveguide layer 223 that are sequentially formed from a top surface of the substrate 210. The second material layer 240 includes a second waveguide layer 241 and a second cladding layer 242 that are sequentially formed from a top surface of the active layer 230.

The substrate 210 may be a sapphire substrate or a GaN or SiC-based, group III-V compound semiconductor substrate. The buffer layer 221 may be an n-type material layer formed of a GaN-based, group III-V compound semiconductor or an undoped material layer. Preferably, the buffer layer 221 may be an n-GaN layer. The first and second cladding layers 222 and 242 may be GaN based, group III-V nitride compound semiconductor layers, and preferably, an n-GaN layer and a p-GaN layer, respectively. Also, the first and second waveguide layers 223 and 241 may be GaN based, group III-V nitride compound semiconductor layers, and preferably, an n-GaN layer and a p-GaN layer, respectively. The first and second waveguide layers 223 and 241 have a reflective index lower than the active layer 230 and higher than the first and second cladding layers 222 and 242.

The active layer 230 is a material layer of emitting light by carrier recombination of an electron and a hole. The active layer 230 may be a GaN-based, group III-V nitride compound semiconductor layer having a multi quantum well (MQW) structure and preferably, an $In_xAl_yGa_{1-x-y}N$ layer where $0 \leq x \leq 1$, $0 \leq y \leq 1$, and $x+y \leq 1$. The active layer 230 may also be a GaN-based, group III-V nitride compound semiconductor layer containing a predetermined ratio of Indium (In), for example, an InGaN layer.

On upper portions of the second cladding layer 242, a ridge portion 251 and a protrusion portion 252 are formed at elevated heights. The ridge portion 251 is formed to reduce a threshold current for laser oscillation and to attain mode stability. The protrusion portion 252 is formed at substantially the same height as the ridge portion 251 to prevent stress concentration on the ridge portion 251 during a flip-chip process for the semiconductor laser diode and a submount. The protrusion portion 252 may be wider than the ridge portion 251.

On a top surface of the ridge portion 251 of the second cladding layer 242, a second electrode layer 271 is formed for electric connection between a bonding metal layer 272 and the ridge portion 251. Also, a current restricting layer 260 covers the entire surface of the second cladding layer 242 except for the surface of the ridge portion 251 where the second electrode layer 271 is formed. The current restricting layer 260 is formed to control a lateral mode. The current restricting layer 260 may be formed of at least one material selected from the group consisting of $SiO_2$, $SiN_x$, and Si. Also, the current restricting layer 260 may be formed of N-type $Al_xGa_{1-x}N$ or undoped $Al_xGa_{1-x}N$ where $0 \leq x \leq 1$.

A portion of the current restricting layer 260, which is formed on the protrusion portion 252, is covered with a protective layer 265. Preferably, the protective layer 265 is formed of material having an etch selectivity different from that of the current restricting layer 260. The protective layer 265 may be formed of at least one material selected from the group consisting of metal, $ZrO_2$, $HfO_2$, $Al_2O_3$, $Ta_2O_5$, and AlN. The metal may include at least one selected from the group consisting of Pt, Pd, Ni, Mo, W, Ru, Ta, Al, Ag, Ir, Co, Os, Cr, Ti, Zr, and Rh. The protective layer 265 may have a thickness of 10 nm to 500 nm. The protective layer 265 prevents current leakage from the bonding metal layer 272 to the protrusion portion 252 of the second cladding layer 242. The protective layer 265 will be further described later in detail when a manufacturing method of a semiconductor laser diode is described. Meanwhile, the protective layer 265 may be made up of multiple layers, and preferably one of the multiple layers contacting the current restricting layer 260 may have a high level of adhesion with respect to the current restricting layer 260. The bonding metal layer 272 is formed on the surfaces of the second electrode layer 271 and the current restricting layer 260 partially covered with the protective layer 265. One top surface portion of the bonding metal layer 272 located above the protrusion portion 252 has at least the same height as another top surface portion located above the ridge portion 251.

The buffer layer 221 includes an exposed top surface at an opposing position to the protrusion portion 252 with respect to the ridge portion 251, and an N-type first electrode layer 282 is formed on the exposed top surface of the buffer layer 221. For insulation between the first and second electrode layers 282 and 271, a passivation layer 290 is formed to cover exposed surfaces of the second cladding layer 242, the second waveguide layer 241, the active layer 230, the first waveguide layer 223, the first cladding layer 222, and the buffer layer 221.

As explained above, the protective layer 265 entirely covers the current restricting layer 260 above protrusion portion 252. However, the protective layer 265 can be formed to cover only corner portions of the current restriction layer 260 above the protrusion portion 252.

Figure 4:
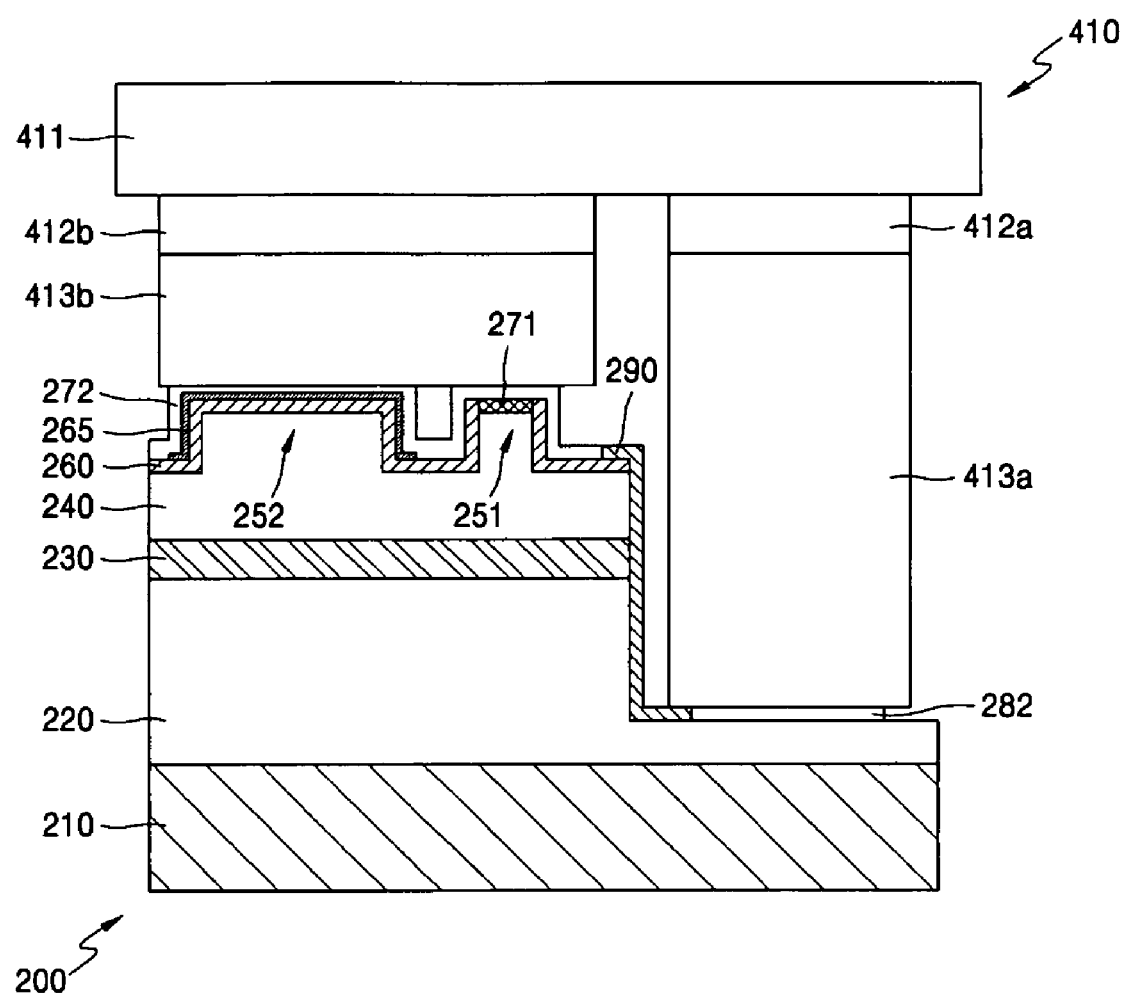
FIG. 4 is a sectional view of a semiconductor laser diode assembly with the semiconductor laser diode depicted in FIG. 3 and a submount to which the semiconductor laser diode is flip-chip bonded.

FIG. 4 is a sectional view of a semiconductor laser diode assembly with the semiconductor laser diode depicted in FIG. 3 and a submount to which the semiconductor laser diode is flip-chip bonded.

Referring to FIG. 4, a submount 410 is a heat discharge structure for preventing overheating of the semiconductor laser diode 200 by heat generated in the active layer 230 during laser oscillation. In FIG. 4, reference numeral 411 denotes submount substrate, reference numerals 412a and 412b denote first and second metal layers, and reference numerals 413a and 413b denote first and second solder layers.

Preferably, the submount substrate 411 is formed of one of AlN, SiC, GaN, and an insulating material having a heat transfer coefficient corresponding to that of one of AlN, SiC, and GaN. The first and second metal layers 412a and 412b are formed of an Au/Cr alloy or a metal material corresponding to the Au/Cr alloy. The first and second solder layers 413a and 413b are formed of an Au/Sn alloy or a metal material corresponding to the Au/Sn alloy. When the semiconductor laser diode 200 is bonded to the submount 410, the first solder layer 413a is fused to the N-type first electrode layer 282 and the second solder layer 413b is fused to the bonding metal layer 272.

As shown in FIG. 4, the protrusion portion 252 is formed at one side of the ridge portion 251 at substantially the same height as the ridge portion 251, and the top surface of the bonding metal layer 272 above the protrusion portion 252 has at least the same as the top surface of the bonding metal layer 272 above the ridge portion 251. Therefore, when the semiconductor laser diode 200 is bonded to the submount 410, the second solder layer 413b comes into contact with the bonding metal layer 272 at the same time above the protrusion portion 252 and the ridge portion 251 or with the protrusion portion 252 first. Then, the second solder layer 413b is molten and spontaneously bonded to the bonding metal layer 272.

As mentioned above, according to the semiconductor laser diode of an exemplary embodiment of the present invention, a thermal stress generated during flip-chip bonding is dispersed to the protrusion portion 252 adjacent to the ridge portion 251. Therefore, uneven light emission due to concentration of a thermal stress on the ridge waveguide can be prevented. In addition, although the first and second solder layers 413a and 413b are not concurrently molten due to their thickness differences, a mechanical stress is dispersed to the protrusion portion 252 with a width wider than the width of the ridge portion 252, and thus, the concentration of a mechanical stress on the ridge portion 251 can be prevented.

Figure 5:
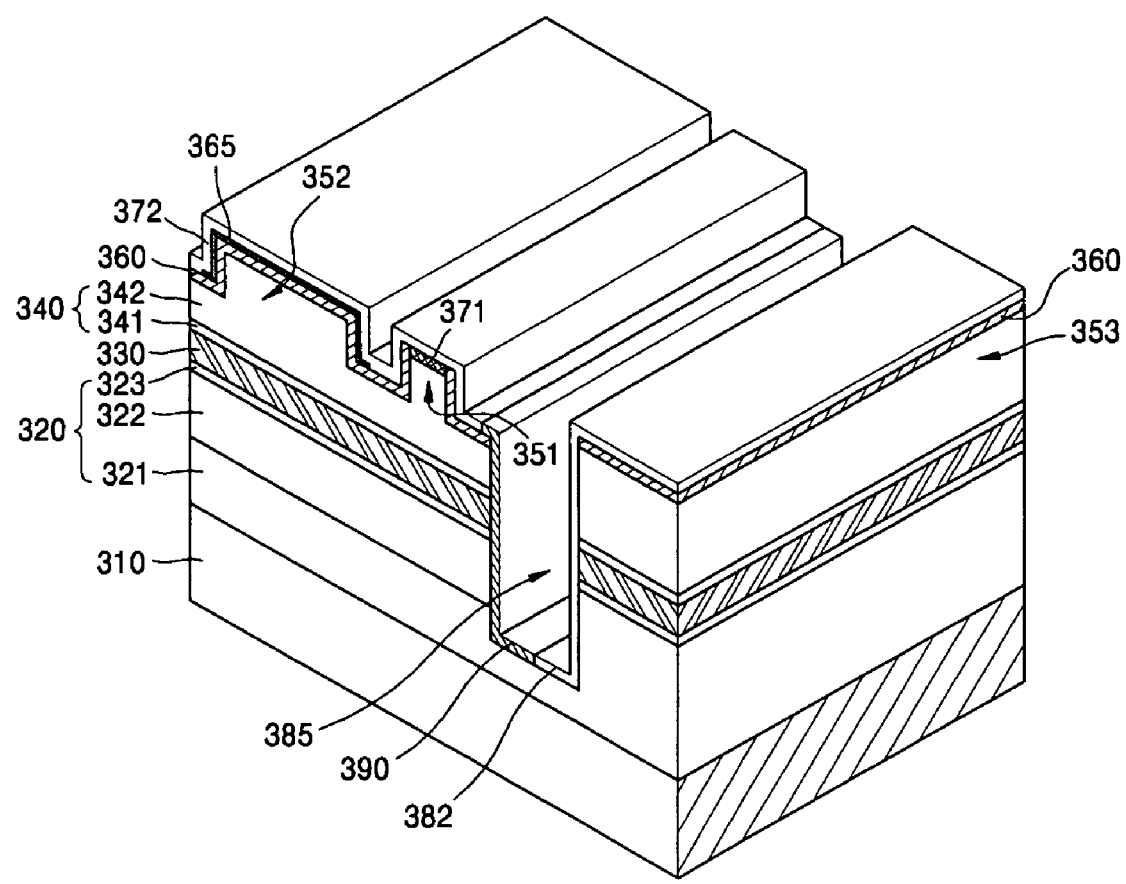
FIG. 5 is a perspective view of a semiconductor laser diode according to another embodiment the present invention.

FIG. 5 is a perspective view of a semiconductor laser diode according to another embodiment the present invention. Referring to FIG. 5, a first material layer 320, an active layer 330, and a second material layer 340 are sequentially formed on a substrate 310. The first material layer 320 includes a buffer layer 321, a first cladding layer 322, and a first waveguide layer 323 that are sequentially formed from a top surface of the substrate 210. The second material layer 340 includes a second waveguide layer 341 and a second cladding layer 342 that are sequentially formed from a top surface of the active layer 330. The substrate 310, the buffer layer 321, the first cladding layer 322, the first waveguide layer 323, the active layer 330, the second waveguide layer 341, and the second cladding layer 342 are formed of the same materials as described above, and thus descriptions thereof will be omitted. Meanwhile, the material layer 320, the active layer 330, and the second material layer 340 are etched to define a trench 385 with a predetermined depth. An upper portion of the buffer layer 321 or the first cladding layer 322 is exposed through the trench 385.

A ridge portion 351 and a first protrusion portion 352 are formed at predetermined heights on upper portions of the second cladding layer 342 beside the trench 385. Also, a second protrusion portion 353 is formed on the buffer layer 321 at the other side of the trench 385. The first and second protrusion portions 352 and 353 have substantially the same height as the ridge portion 351 to prevent concentration of stress on the ridge portion 351 during a flip-chip process of a semiconductor laser diode and a submount.

A second electrode 371 is formed on a top surface of the ridge portion 351, and a current restricting layer 360 formed of insulating material is formed entirely over the second cladding layer 342 including the first and second protrusion portions 352 and 353 and the ridge portion 351. Here, the current restricting layer 360 exposes the second electrode 371. Also, a protective layer 365 is formed on a surface of the current restricting layer 360 above the first protrusion portion 352. Meanwhile, the protective layer 365 can be formed to cover only corner portions of the current restricting layer 360 above the first protrusion portion 352. As described above, the protective layer 365 may be formed of material having an etch selectivity different from that of the current restricting layer 360. The protective layer 365 may have a thickness of 10 to 500 nm. Meanwhile, the protective layer 365 can be made up of multiple layers, and preferably one of the multiple layers contacting the current restricting layer 360 may have a high level of adhesion with respect to the current restricting layer 360. A bonding metal layer 372 is formed on the surfaces of the second electrode layer 371 and the current restricting layer 360. Preferably, one top surface portion of the bonding metal layer 372 above the first protrusion portion 352 has at least the same height as another top surface portion of the bonding metal layer 372 above the ridge portion 351.

Meanwhile, an N-type first electrode layer 382 is extended from the exposed upper portion of the buffer layer 321 or the first cladding layer 322 to a top surface of the current restricting layer 360 above the second protrusion portion 353. A top surface of the first electrode layer 382 above the second protrusion portion 353 may have at least the same height as the another top surface portion of the bonding metal layer 372 above the ridge portion 351. Here, the top surface of the first electrode layer 382 above the second protrusion portion 353 may have the same height as the one top surface portion of the bonding metal layer 372 above the first protrusion portion 352. Further, there may be a height difference of 0.5 μm or less between the top surface of the first electrode layer 382 above the second protrusion 353 and the one top surface portion of the bonding metal layer 372 above the first protrusion portion 352.

Between the first electrode layer 382 and the second electrode layer 371, an insulating passivation layer 390 is formed to cover the exposed surfaces of the second cladding layer 342, the second waveguide layer 341, the active layer 330, the first waveguide layer 323, the first cladding layer 322, and the buffer layer 321. Meanwhile, the protective layer 365 can be formed on the current restricting layer 360 above the second protrusion portion 353. In this case, the first electrode layer 382 may be formed from the exposed upper surface of the buffer layer 321 or the first cladding layer 322 to the upper surface of the protective layer 365 formed on the current restricting layer 360 above the second protrusion portion 353.

Figure 6:
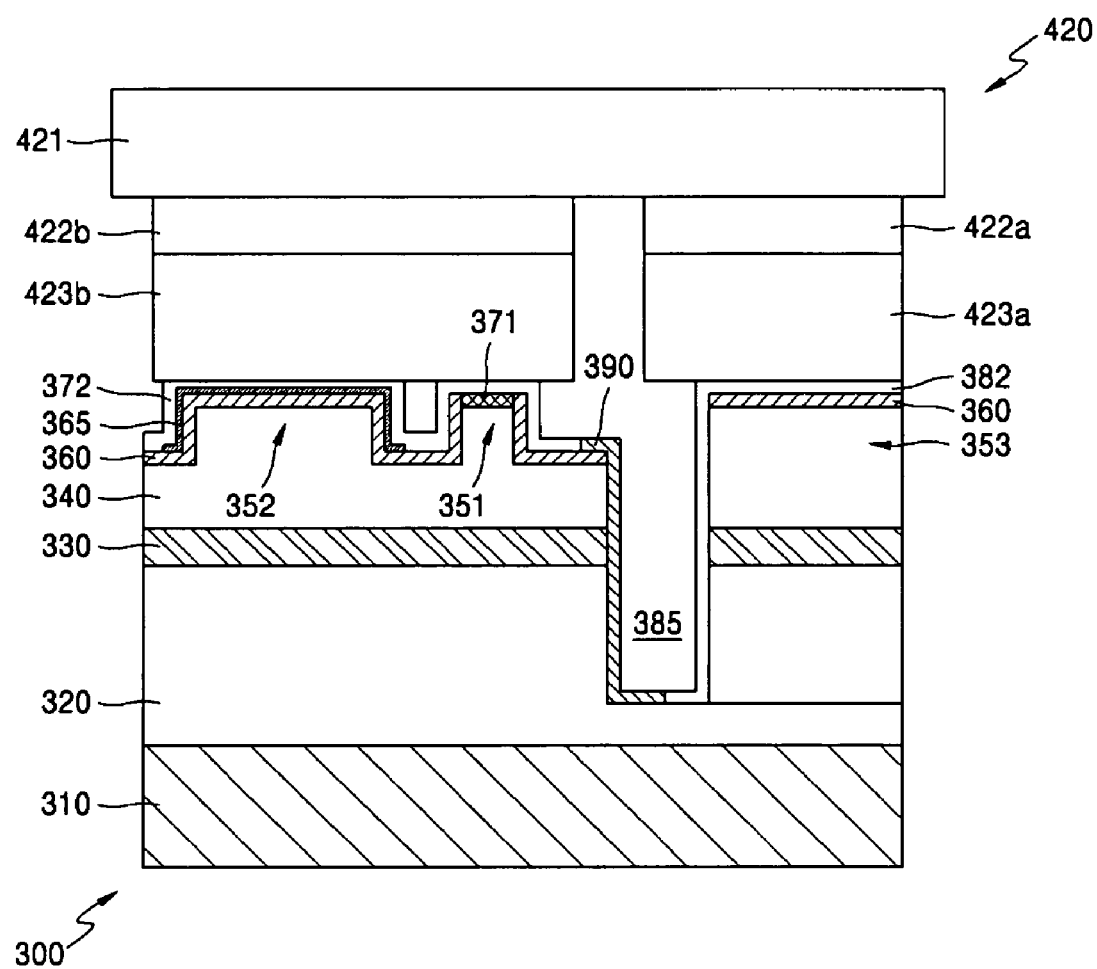
FIG. 6 is a sectional view of a semiconductor laser diode assembly with the semiconductor laser diode depicted in FIG. 5 and a submount to which the semiconductor laser diode is flip-chip bonded.

FIG. 6 is a sectional view of a semiconductor laser diode assembly with the semiconductor laser diode depicted in FIG. 5 and a submount to which the semiconductor laser diode is flip-chip bonded. Referring to FIG. 6, a submount 420 is a heat discharge structure for preventing overheating of the semiconductor laser diode 300 by heat generated in the active layer 330 during laser oscillation. In FIG. 6, reference numeral 421 denotes a submount substrate, reference numerals 422a and 422b denote first and second metal layers, and reference numerals 423a and 423b denote first and second solder layers.

Preferably, the submount substrate 421 is formed of one of AlN, SiC, GaN, and an insulating material having a heat transfer coefficient corresponding to that of one of AlN, SiC, and GaN. The first and second metal layers 422a and 422b are formed of an Au/Cr alloy or a metal material corresponding to the Au/Cr alloy. The first and second solder layers 423a and 423b are formed of an Au/Sn alloy or a metal material corresponding to the Au/Sn alloy. When the semiconductor laser diode 300 is bonded to the submount 420, the first solder layer 423a is fused to the N-type first electrode layer 382 and the second solder layer 423b is fused to the bonding metal layer 372.

As shown in FIG. 6, the first and second protrusion portions 352 and 353 are respectively formed at one and the other sides of the ridge portion 351 at substantially the same height as the ridge portion 351. Therefore, when the semiconductor laser diode 300 is bonded to the submount 420, the second solder layer 423b comes into contact with the bonding metal layer 272 above the first protrusion portion 352 and the ridge portion 351, and at the same time the first solder layer 423a comes into contact with the first electrode layer 382 formed above the second protrusion portion 353. Then, the first solder layer 423a is molten and spontaneously bonded to the first electrode layer 382 formed above the second protrusion portion 353, and the second solder layer 423b is bonded to the bonding metal layer 372 formed above the ridge portion 351 and the first protrusion portion 352.

Figure 7:
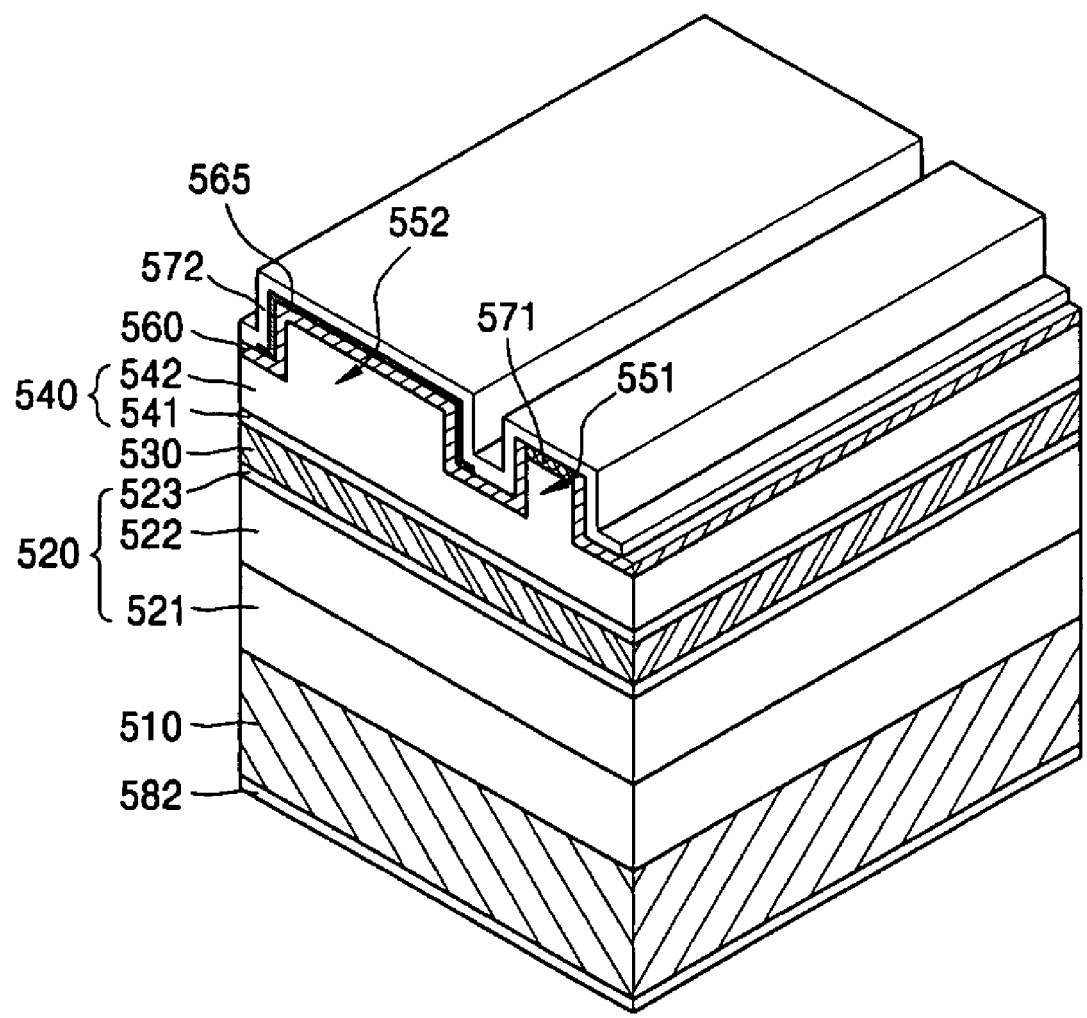
FIG. 7 is a perspective view of a semiconductor laser diode according to yet another embodiment the present invention.

FIG. 7 is a perspective view of a semiconductor laser diode according to yet another embodiment the present invention. Referring to FIG. 7, a first material layer 520, an active layer 530, and a second material layer 540 are sequentially formed on a substrate 510. The first material layer 520 includes a buffer layer 521, a first cladding layer 522, and a first waveguide layer 523 that are sequentially formed from a top surface of the substrate 510. The second material layer 540 includes a second waveguide layer 541 and a second cladding layer 542 that are sequentially formed from a top surface of the active layer 530. The substrate 510, the buffer layer 521, the first cladding layer 522, the first waveguide layer 523, the active layer 530, the second waveguide layer 541, and the second cladding layer 542 are formed of the same materials as described above, and thus descriptions thereof will be omitted.

A ridge portion 551 and a protrusion portion 552 are formed at predetermined heights on upper portions of the second cladding layer 542. As described above, the protrusion portion 552 has substantially the same height as the ridge portion 551 to prevent concentration of stress on the ridge portion 551 during a flip-chip process of a semiconductor laser diode and a submount. A second electrode 571 is formed on a top surface of the ridge portion 551 of the second cladding layer 542, and a current restricting layer 560 is formed entirely over the second cladding layer 542 including the protrusion portion 552 and the ridge portion 551. Here, the current restricting layer 560 exposes the second electrode 571. Also, a protective layer 565 is formed on a surface of the current restricting layer 560 above the protrusion portion 552. Meanwhile, the protective layer 565 can be formed to cover only corner portions of the current restricting layer 560 above the protrusion portion 552. As described above, the protective layer 565 may be formed of material having an etch selectivity different from that of the current restricting layer 560. The protective layer 565 may have a thickness of 10 to 500 nm. Meanwhile, the protective layer 565 can be made up of multiple layers, and preferably one of the multiple layers contacting the current restricting layer 560 may be adhesive to the current restricting layer 560. A bonding metal layer 572 is formed on the surfaces of the second electrode layer 571 and the current restricting layer 560 covered by the protective layer 565, and an N-type first electrode layer 582 is formed on a bottom surface of the substrate 510. One top surface portion of the bonding metal layer 572 above the protrusion portion 552 may have at least the same height as another top surface portion of the bonding metal layer 572 above the ridge portion 551.

A method of manufacturing a semiconductor laser diode according to an embodiment of the present invention will now be described. FIGS. 8A through 8H are sectional views illustrating a method of manufacturing the semiconductor laser diode depicted in FIG. 3.

Figure 8A:
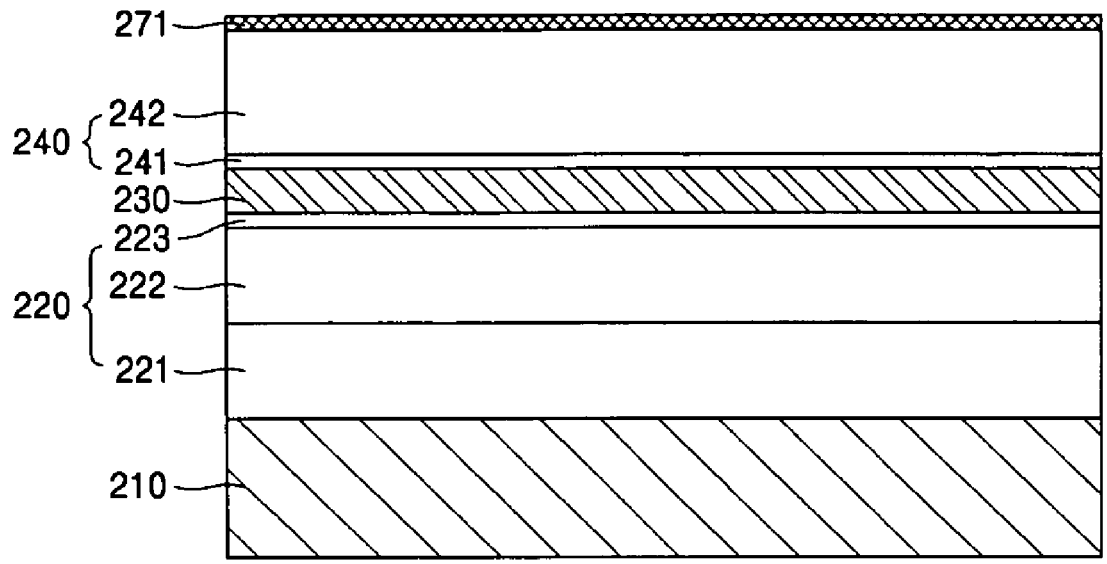
FIGS. 8A through 8H shows a method of manufacturing a semiconductor laser diode according to an embodiment of the present invention.

First, referring to FIG. 8A, a first material layer 220, an active layer 230, a second material layer 240, and a second electrode layer 271 are sequentially formed on a substrate 210. The first material layer 220 can be formed by sequentially mounting a buffer layer 221, a first cladding layer 222, and a first waveguide layer 223 on the substrate 210. The second material layer 240 can be formed by sequentially mounting a second waveguide layer 241 and a second cladding layer 242 on the active layer 230.

The substrate 210 may be a sapphire substrate or a GaN or SiC-based, group III-V compound semiconductor substrate. The buffer layer 221 may be an n-type material layer formed of a GaN-based, group III-V compound semiconductor or an undoped material layer. Preferably, the buffer layer 221 may be an n-GaN layer. The first and second cladding layers 222 and 242 may be GaN based, group III-V nitride compound semiconductor layers, and preferably, an n-GaN layer and a p-GaN layer, respectively. Also, the first and second waveguide layers 223 and 241 may be GaN based, group III-V nitride compound semiconductor layers, and preferably, an n-GaN layer and a p-GaN layer, respectively. The active layer 230 may be a GaN-based, group III-V nitride compound semiconductor layer and preferably, an $In_xAl_yGa_{1-x-y}N$ layer where $0 \leq x \leq 1$, $0 \leq y \leq 1$, and $x+y \leq 1$. The active layer 130 may also be a GaN-based, group III-V nitride compound semiconductor layer containing a predetermined ratio of Indium (In), for example, an InGaN layer.

Figure 8B:
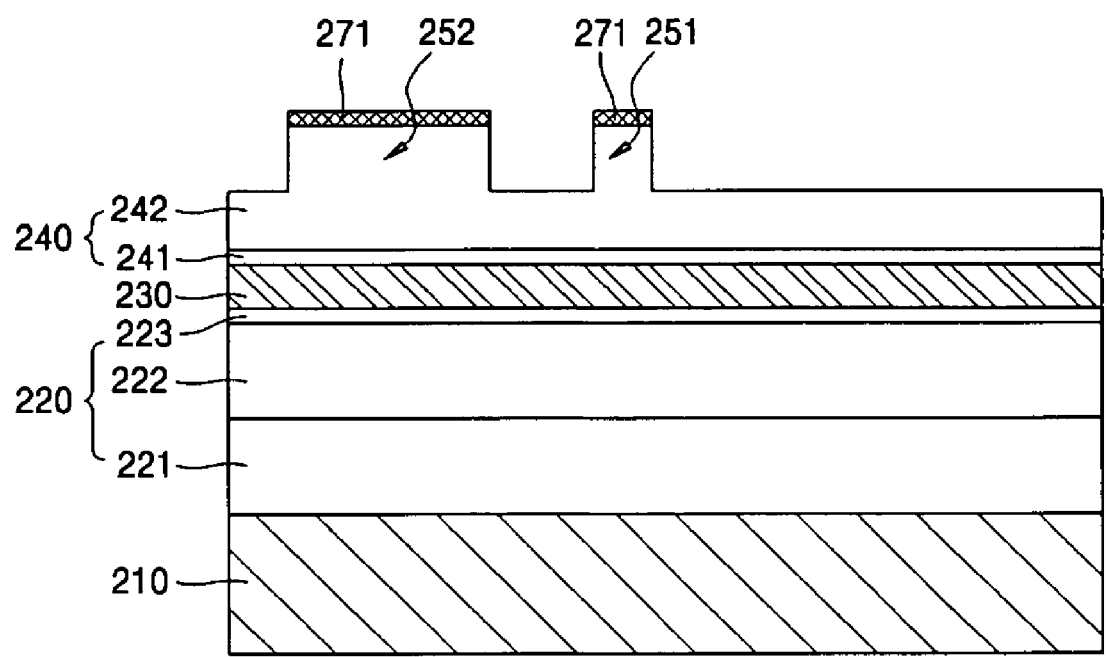

Next, referring to FIG. 8B, the second electrode layer 271 and the second cladding layer 242 are etched to form a ridge portion 251 and a protrusion portion 252 at predetermined heights on upper portions of the second cladding layer 242, and then the second electrode layer 271 on the protrusion portion 252 is removed. Meanwhile, the second electrode layer 271 on the protrusion portion 252 can be remained, unlike the drawings.

Figure 8C:
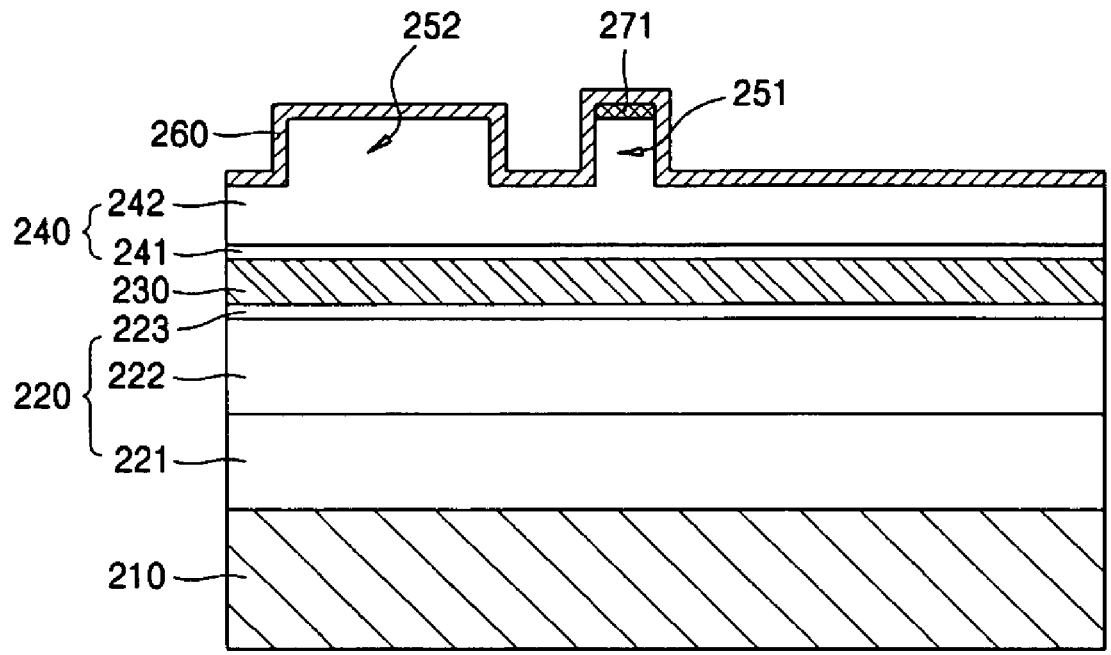

Next, referring to FIG. 8C, a current restricting layer 260 is formed to entirely cover the second cladding layer 242 and the second electrode layer 271. The current restricting layer 260 may be formed of at least one material selected from the group consisting of $SiO_2$, $SiN_x$, and Si. Also, the current restricting layer 260 may be formed of N-type $Al_xGa_{1-x}N$ or undoped $Al_xGa_{1-x}N$ where $0 \leq x \leq 1$.

Figure 8D:
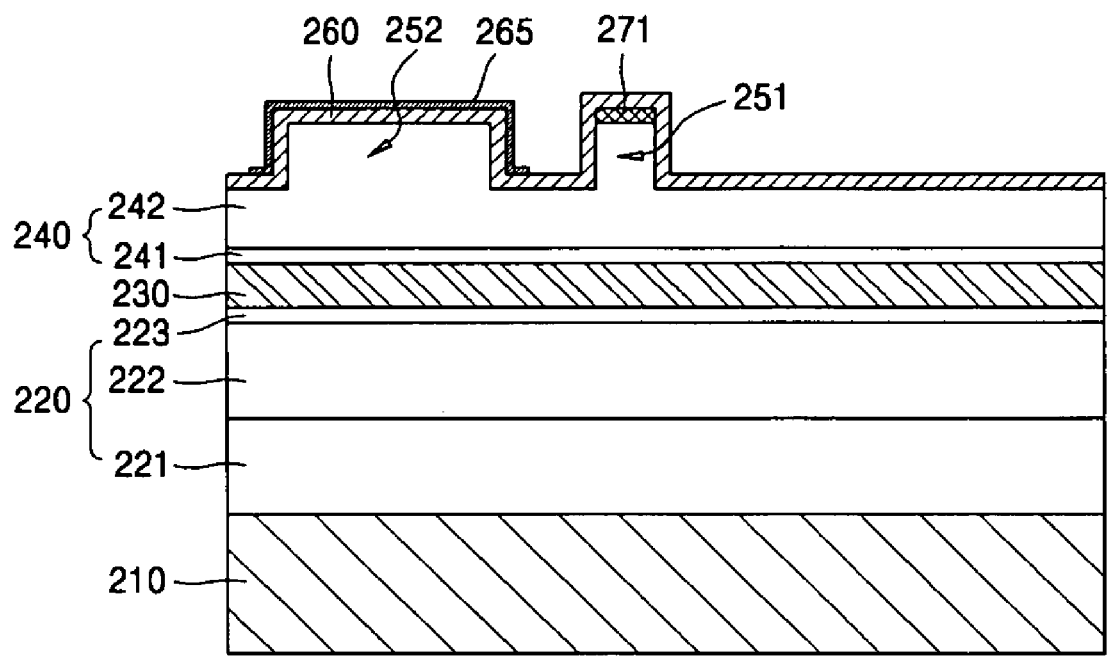

Next, referring to FIG. 8D, a portion of the current restricting layer 260, which is formed on the protrusion portion 252, is covered with a protective layer 265 having a predetermined thickness. In FIG. 8D, the protective layer 265 is formed entirely over the current restricting layer 260 above the protrusion portion 252; however, the protective layer 265 can be formed to cover only corner portions of the current restricting layer 260 above the protrusion portion 252. Here, the protective layer 265 can be formed as following ways. In a first way, a protective layer material is formed entirely over the current restricting layer 260, and then the protective layer material is removed except for the portion above the top and side surfaces of the protrusion portion 252 to form the protective layer 265. In a second way, a protective layer material is formed entirely over the current restricting layer 260, and then the protective layer material is patterned through a photolithography to form the protective layer 265.

Preferably, the protective layer 265 is formed of material having an etch selectivity different from that of the current restricting layer 260. The protective layer 265 may be formed of at least one material selected from the group consisting of metal, $ZrO_2$, $HfO_2$, $Al_2O_3$, $Ta_2O_5$, and AlN. The metal may include at least one selected from the group consisting of Pt, Pd, Ni, Mo, W, Ru, Ta, Al, Ag, Ir, Co, Os, Cr, Ti, Zr, and Rh. The protective layer 265 may have a thickness of 10 to 500 nm. Meanwhile, the protective layer 265 may be made up of multiple layers, and preferably one of the multiple layers contacting the current restricting layer 260 may be adhesive to the current restricting layer 260.

Figure 8E:
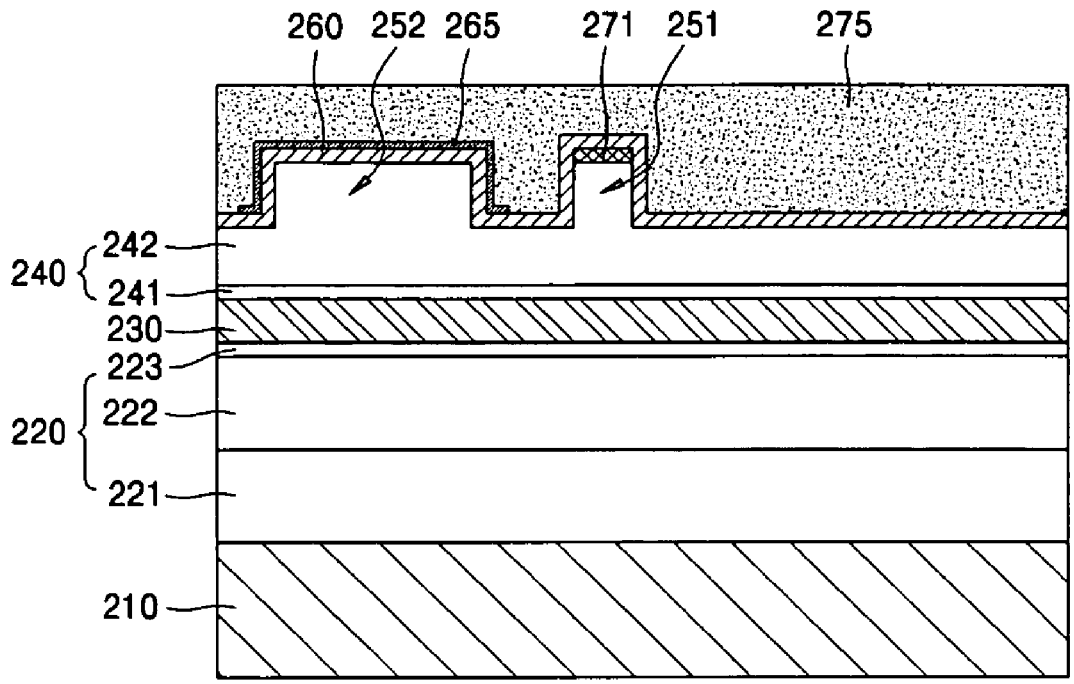
Figure 8F:
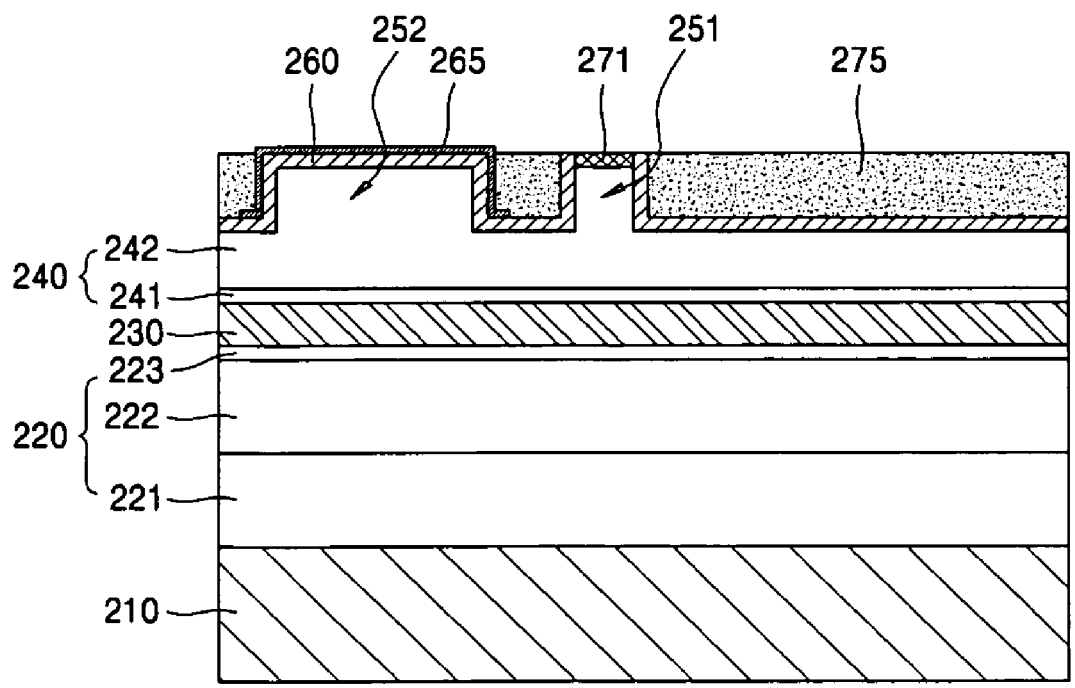
Figure 9A:
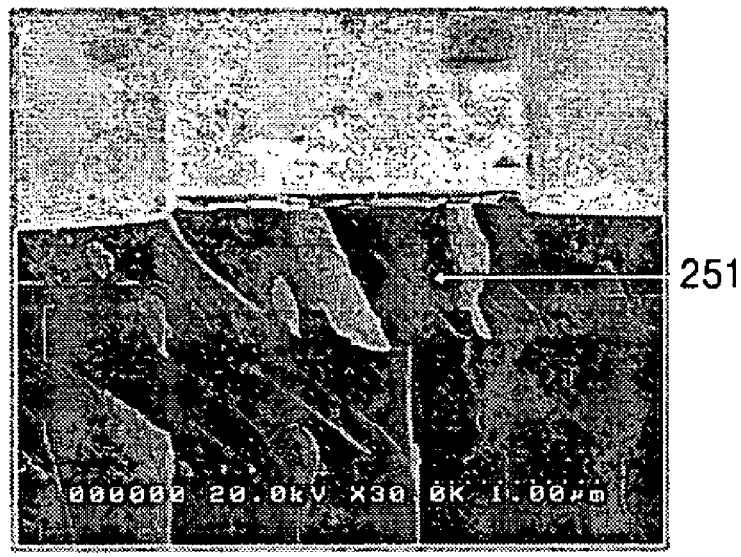
FIGS. 9A and 9B are SEM photographs respectively showing sections of a ridge portion and a protrusion portion after planarization according to an embodiment of the present invention.
Figure 9B:

Then, the protective layer 265 and the second electrode layer on the ridge portion 251 are exposed through an etch-back planarization. Specifically, as shown in FIG. 8E, a photoresist 275 is formed on the protective layer 265 and the current restricting layer 260 to a predetermined thickness. Next, as shown in FIG. 8F, the photoresist 275 and the current restricting layer 260 formed on the second electrode layer 271 are sequentially etched to expose the second electrode 271 formed on the ridge portion 251. Meanwhile, the protective layer formed on the protrusion portion 252 is also exposed during the etch-back planarization. Since the protective layer 265 has an etch selectivity different from that of the current restricting layer 260, the protective layer 265 can be remained above the protrusion portion 252 while the photoresist 275 and the current restricting layer 260 are etched. FIGS. 9A and 9B are SEM photographs respectively showing sections of the ridge portion 251 and the protrusion portion 252 after the etch-back planarization according to the present disclosure. Referring to FIGS. 9A and 9B, it can be seen that the second electrode layer 271 on the ridge portion 251 and the protective layer 265 above the protrusion portion 252 are exposed. After that, the remaining photoresist 275 is removed from the current restricting layer 260.

Figure 2:
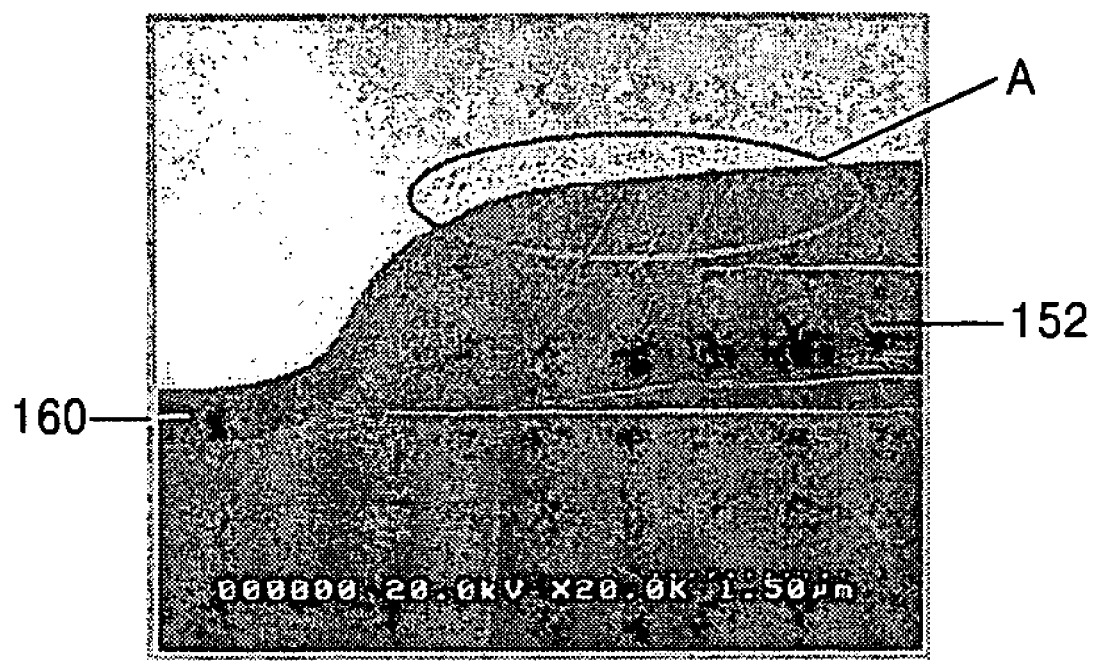
FIG. 2 is an SEM photograph showing an exposed corner "A" of a protrusion portion due to over etching of a current restricting layer during an etch-back planarization, which is performed without preparing a protective layer on the current restricting layer located on the protrusion portion.

Meanwhile, if the protective layer 265 is not formed on the current restricting layer 260 above the protrusion portion 252 of the second cladding layer 242, the current restricting layer 260 on the protrusion portion 252 is removed due to over etching during the etch-back planarization which is performed to expose the second electrode layer 271 formed on the ridge portion 251. FIG. 2 is an SEM photograph showing an exposed corner "A" of a protrusion portion due to over etching of a current restricting layer during an etch-back planarization, which is performed without preparing a protective layer on the current restricting layer located on the protrusion portion. As like this, if a bonding metal layer is formed on the exposed protrusion portion, the bonding metal layer makes contact with the protrusion portion to thereby cause current leakage. To solve this problem, the protective layer 265 with an etch selectivity different from that of the current restricting layer 260 is formed on the current restricting layer 260 above the protrusion portion 252 according to the embodiment of the present invention. Therefore, the current leakage from the bonding metal layer to the protrusion portion 252 of the second cladding layer 242 can be prevented.

Figure 8G:
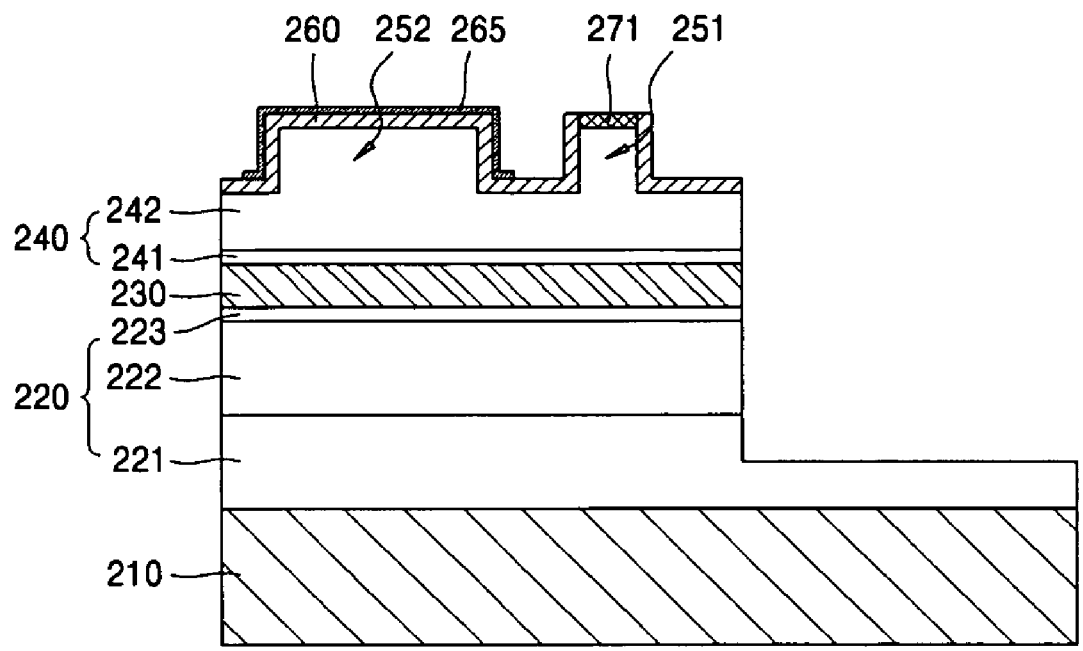
Figure 8H:
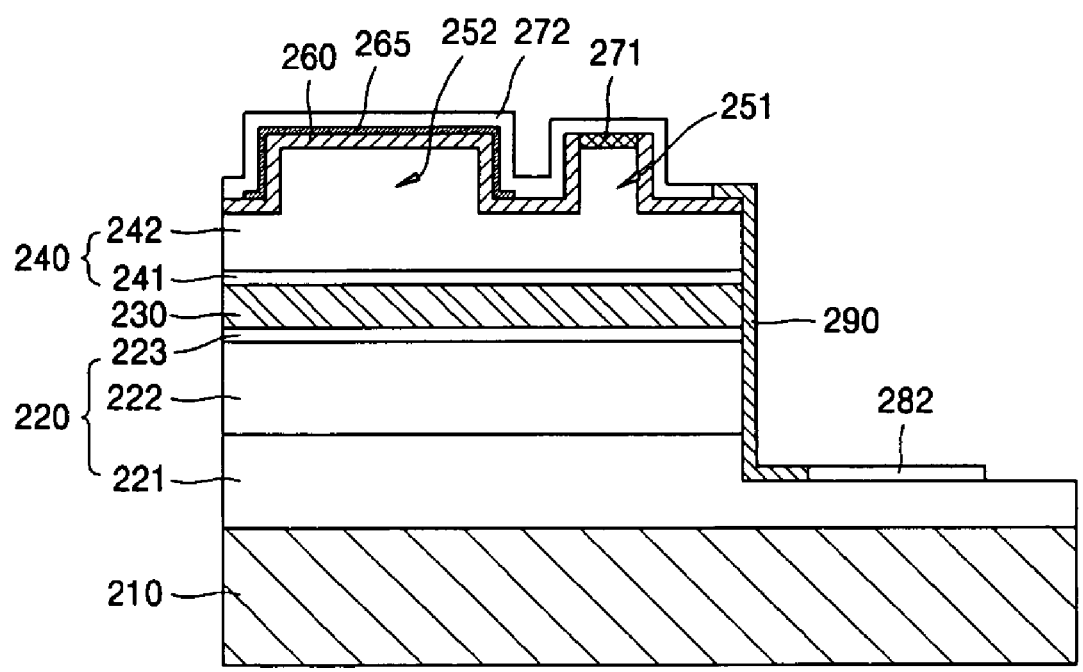

Next, referring to FIG. 8G, the current restricting layer 260, the second cladding layer 242, the second waveguide layer 241, the active layer 230, the first waveguide layer 223, the first cladding layer 222, and the buffer layer 221 are sequentially etched at an opposing portion to the protrusion portion 252 with respect to the ridge portion 251 to expose an upper portion of the buffer layer 221. Next, referring to FIG. 8H, a first electrode layer 282, a N-type electrode layer, is formed on the exposed upper portion of the buffer layer 221, and a bonding metal layer 272 is formed on the current restricting layer 260 to cover the protective layer 265 and the second electrode layer 271. After that, for insulation between the first electrode layer 282 and the bonding metal layer 272, a passivation layer 290 is formed to cover exposed surfaces of the second cladding layer 242, the second waveguide layer 241, the active layer 230, the first waveguide layer 223, the first cladding layer 222, and the buffer layer 221. Meanwhile, the semiconductor laser diodes depicted in FIGS. 5 and 7 can be manufactured through a similar method to the aforementioned method. Thus, description thereof will be omitted.

As described above, the protective layer with an etch selectivity different from that of the current restricting layer is formed on the current restricting layer above the protrusion portion so that the current leakage from the bonding metal layer to the protrusion portion can be prevented and the stability of manufacturing process can be improved.

While the present invention has been particularly shown and described with reference to exemplary embodiments thereof, it will be understood by those of ordinary skill in the art that various changes in form and details may be made in the embodiments. For example, the stacked structure of the semiconductor laser diode of the present invention is not limited to the structures herein described. Further, other kinds of group III-V compound semiconductor materials can be included in the stacked structure of the semiconductor laser diode, as another embodiment of the present invention. Also, the order of each operation of the manufacturing method of semiconductor laser diode of the present invention can be different from the illustrated exemplary method. Therefore, the scope of the present invention is defined by the appended claims.

What is claimed is:

1. A semiconductor laser diode comprising:
a first material layer, an active layer, and a second material layer that are sequentially formed on a substrate;
a ridge portion and a first protrusion portion that are formed on the second material layer in a direction perpendicular to the active layer, the first protrusion portion being formed at one side of the ridge portion;
an electrode layer formed in contact with a top surface of the ridge portion;
a current restricting layer formed on an entire surface of the second material layer and exposing the electrode layer;
a protective layer formed only on a surface of the current restricting layer above the first protrusion portion and having an etch selectivity different from that of the current restricting layer; and
a bonding metal layer formed on the current restricting layer and the protective layer in electrical connection with the electrode layer.

2. The semiconductor laser diode of claim 1, wherein the first material layer includes a buffer layer, a first cladding layer, and a first waveguide layer that are sequentially formed on the substrate.

3. The semiconductor laser diode of claim 1, wherein the second material layer includes a second waveguide layer and a second cladding layer that are sequentially formed on the active layer, and the ridge portion and the first protrusion portion are formed on the second cladding layer.

4. The semiconductor laser diode of claim 1, wherein the current restricting layer is formed of at least one material selected from the group consisting of $SiO_2$, SiN, and Si.

5. The semiconductor laser diode of claim 1, wherein the current restricting layer is formed of N-type AlGaN or undoped AlGaN.

6. The semiconductor laser diode of claim 1, wherein the protective layer is formed of at least one selected from the group consisting of metal, $ZrO_2$, $HfO_2$, $Al_2O_3$, $Ta_2O_5$, and AlN.

7. The semiconductor laser diode of claim 6, wherein the bonding metal includes at least one selected from the group consisting of Pt, Pd, Ni, Mo, W, Ru, Ta, Al, Ag, Ir, Co, Os, Cr, Ti, Zr, and Rh.

8. The semiconductor laser diode of claim 1, wherein the protective layer has a thickness of 10 nm to 500 nm.

9. The semiconductor laser diode of claim 1, wherein the protective layer is formed to cover a corner portion of the current restricting layer above the first protrusion portion.

10. The semiconductor laser diode of claim 1, wherein the first protrusion portion is formed at substantially the same height as the ridge portion.

11. The semiconductor laser diode of claim 10, wherein a top surface of the bonding metal layer located above the first protrusion portion has at least the same height as a top surface of the bonding metal layer located above the ridge portion.

12. The semiconductor laser diode of claim 1, wherein the electrode layer is a second electrode layer, and wherein the first material layer includes an exposed surface at the other side of the ridge portion, and a first electrode layer is formed on the exposed surface.

13. The semiconductor laser diode of claim 1, wherein a second protrusion is formed at the other side of the ridge portion at substantially the same height as the ridge portion.

14. The semiconductor laser diode of claim 13, wherein the electrode layer is a second electrode layer, wherein the second protrusion portion is separated from the ridge portion by a trench defined therebetween to expose the first material layer, and a first electrode layer is formed on the current restricting layer above the second protrusion portion in electrical connection with the exposed surface of the first material layer.

15. The semiconductor laser diode of claim 14, wherein a top surface of the first electrode layer located above the second protrusion portion has at least the same height as a top surface of the bonding metal layer located above the ridge portion.

16. The semiconductor laser diode of claim 15, wherein a top surface of the bonding metal layer located above the first protrusion portion has the same height as the top surface of the first electrode layer located above the second protrusion portion.

17. The semiconductor laser diode of claim 15, wherein a top surface of the bonding metal layer located above the first protrusion portion and the top surface of the first electrode layer located above the second protrusion portion are different in height by 0.5 μm or less.

18. The semiconductor laser diode of claim 14, further comprising a protective layer between the current restricting layer and the first electrode layer that are formed on the second protrusion portion.

19. The semiconductor laser diode of claim 1, wherein the electrode layer is a second electrode layer, and wherein a first electrode layer is formed on a bottom surface of the substrate.

20. A semiconductor laser diode assembly comprising: a semiconductor laser diode and a submount to which the semiconductor laser diode is flip-chip bonded,
the semiconductor laser diode including:
a first material layer, an active layer, and a second material layer that are sequentially formed on a substrate;
a ridge portion and a protrusion portion that are formed on the second material layer in a direction perpendicular to the active layer, the protrusion portion being formed at one side of the ridge portion;
a second electrode layer formed in contact with a top surface of the ridge portion;
a current restricting layer formed on an entire surface of the second material layer and exposing the second electrode layer;
a protective layer formed only on a surface of the current restricting layer above the protrusion portion and having an etch selectivity different from that of the current restricting layer;
a bonding metal layer formed on the current restricting layer and the protective layer in electrical connection with the second electrode layer; and
a first electrode layer formed on an exposed surface of the first material layer, the exposed surface being formed at the other side of the ridge portion, the submount including:
a first solder layer bonded to the first electrode layer; and
a second solder layer bonded to the bonding metal layer above the ridge portion and the protrusion portion.

21. The semiconductor laser diode assembly of claim 20, wherein a top surface of the bonding metal layer located above the protrusion portion has at least the same height as a top surface of the bonding metal layer located above the ridge portion.

22. A semiconductor laser diode assembly comprising:
a semiconductor laser diode and a submount to which the semiconductor laser diode is flip-chip bonded,
the semiconductor laser diode including:
a first material layer, an active layer, and a second material layer that are sequentially formed on a substrate;
a ridge portion and a first protrusion portion that are formed on the second material layer in a direction perpendicular to the active layer, the first protrusion portion being formed at one side of the ridge portion;
a second protrusion formed at the other side of the ridge portion and separated from the ridge portion by a trench defined therebetween to expose the first material layer;
a second electrode layer formed in contact with a top surface of the ridge portion;
a current restricting layer formed on an entire surface of the second material layer and exposing the second electrode layer;
a protective layer formed only on a surface of the current restricting layer above the first protrusion portion and having an etch selectivity different from that of the current restricting layer;
a bonding metal layer formed on the current restricting layer and the protective layer in electrical connection with the second electrode layer; and
a first electrode layer formed on the current restricting layer above the second protrusion portion in electrical connection with the exposed surface of the first material layer,
the submount including:
a first solder layer bonded to the first electrode layer located above the second protrusion; and
a second solder layer bonded to the bonding metal layer located above the ridge portion and the first protrusion portion.

23. The semiconductor laser diode assembly of claim 22, wherein a top surface of the first electrode layer located above the second protrusion portion has at least the same height as a top surface of the bonding metal layer located above the ridge portion.

24. The semiconductor laser diode assembly of claim 22, wherein a top surface of the bonding metal layer located above the first protrusion portion has the same height as a top surface of the first electrode layer located above the second protrusion portion.

25. The semiconductor laser diode assembly of claim 22, further comprising a protective layer between the current restricting layer and the first electrode layer that are formed on the second protrusion portion.

26. A method for manufacturing a semiconductor laser diode, comprising:
sequentially forming a first material layer, an active layer, a second material layer, and an electrode layer on a substrate;
forming a ridge portion and a protrusion portion on upper portions of the second material layer by sequentially etching the electrode layer and the second material layer;
forming a current restricting layer to cover the second material layer and the electrode layer;
forming a protective layer only on the current restricting layer above the protrusion portion, the protective layer being formed of material having an etch selectivity different from that of the current restricting layer;
exposing the protective layer and the electrode layer formed on the ridge portion through planarization; and
forming a bonding metal layer on the current restricting layer to cover the electrode layer and the protective layer.

27. The method of claim 26, further comprising removing the electrode layer from the protrusion portion after the forming of the ridge portion and the protrusion portion.

28. The method of claim 26, wherein the current restricting layer is formed of at least one material selected from the group consisting of $SiO_2$, $SiN_X$, and Si.

29. The method of claim 26, wherein the current restricting layer is formed of N-type AlGaN or undoped AlGaN.

30. The method of claim 26, wherein the protective layer is formed of at least one selected from the group consisting of metal, $ZrO_2$, $HfO_2$, $Al_2O_3$, $Ta_2O_5$, and AlN.

31. The method of claim 30, wherein the metal includes at least one selected from the group consisting of Pt, Pd, Ni, Mo, W, Ru, Ta, Al, Ag, Ir, Co, Os, Cr, Ti, Zr, and Rh.

32. The method of claim 26, wherein the protective layer has a thickness of 10 nm to 500 nm.

33. The method of claim 26, wherein the protective layer is formed to cover the current restricting layer above the protrusion portion or to cover a corner portion of the current restricting layer above the protrusion portion.

34. The method of claim 26, wherein the exposing of the protective layer and the electrode layer includes:

depositing photoresist on the current restricting layer to a predetermined thickness to cover the protective layer;

sequentially etching the photoresist and the current restricting layer formed above the ridge portion to expose the protective layer and the electrode layer formed on the ridge portion; and removing the photoresist remained on the current restricting layer.

35. A method for manufacturing a semiconductor laser diode, comprising:

sequentially forming a first material layer, an active layer, and a second material layer on a substrate;

forming a ridge portion and a first protrusion portion on the second material layer in a direction perpendicular to the active layer, the first protrusion portion being formed at one side of the ridge portion;

forming a second electrode layer in contact with a top surface of the ridge portion; forming a current restricting layer on an entire surface of the second material layer and exposing the second electrode layer;

forming a protective layer only on a surface of the current restricting layer above the first protrusion portion and having an etch selectivity different from that of the current restricting layer; and forming a bonding metal layer on the current restricting layer and the protective layer in electrical connection with the second electrode layer.

* * * * *